United States Patent
Song et al.

(10) Patent No.: US 11,316,052 B2
(45) Date of Patent: Apr. 26, 2022

(54) JUNCTION BARRIER SCHOTTKY DIODE

(71) Applicant: Xidian University, Xi'an (CN)

(72) Inventors: Qingwen Song, Xi'an (CN); Xiaoyan Tang, Xi'an (CN); Yuming Zhang, Xi'an (CN); Hao Yuan, Xi'an (CN); Chao Han, Xi'an (CN)

(73) Assignee: XIDIAN UNIVERSITY, Xi'An (CN)

( * ) Notice: Subject to any disclaimer, the term of this patent is extended or adjusted under 35 U.S.C. 154(b) by 0 days.

(21) Appl. No.: 17/263,365

(22) PCT Filed: May 9, 2020

(86) PCT No.: PCT/CN2020/089347
§ 371 (c)(1),
(2) Date: Jan. 26, 2021

(87) PCT Pub. No.: WO2020/238587
PCT Pub. Date: Dec. 3, 2020

(65) Prior Publication Data
US 2021/0296512 A1    Sep. 23, 2021

(30) Foreign Application Priority Data

May 29, 2019  (CN) .......................... 201910458036.7
May 29, 2019  (CN) .......................... 201910458045.6

(51) Int. Cl.
*H01L 29/872*   (2006.01)
*H01L 29/47*    (2006.01)

(52) U.S. Cl.
CPC ............ *H01L 29/872* (2013.01); *H01L 29/47* (2013.01)

(58) Field of Classification Search
CPC ........ H01L 29/47; H01L 29/87; H01L 29/872
USPC ......................................................... 257/471
See application file for complete search history.

(56) References Cited

U.S. PATENT DOCUMENTS 7,999,345 B2 *  8/2011  Nakazawa .......... H01L 29/7813
                                                      257/471

* cited by examiner

*Primary Examiner* — Monica D Harrison
(74) *Attorney, Agent, or Firm* — WPAT, PC

(57) ABSTRACT

A junction barrier schottky (JBS) diode is provided and includes: a bottom metal layer, a N⁺-type substrate layer and a N⁻-type epitaxial layer sequentially arranged in that order from bottom to top, P-type ion injection regions are disposed on an upper surface of the N⁻-type epitaxial layer, distances of the P-type ion injection regions are gradually increased along a direction from an edge to a center of the JBS diode; an isolation dielectric layer is arranged on a periphery of the upper surface of the N⁻-type epitaxial layer, an top metal layer is arranged on the upper surface of the N⁻-type epitaxial layer and an upper surface of the isolation dielectric layer and further is in contact with the P-type ion injection regions. The JBS diode can effectively inhibit an occurrence of local electromigration and improve a device reliability.

16 Claims, 6 Drawing Sheets

JUNCTION BARRIER SCHOTTKY DIODE

TECHNICAL FIELD

The disclosure relates to the field of microelectronics technologies, and more particularly to a junction barrier schottky diode.

DESCRIPTION OF RELATED ART

A wide band-gap semiconductor material is a third-generation semiconductor material developed after a first-generation of silicon, germanium, and a second-generation of gallium arsenide, indium phosphide and other materials. Among the third-generation semiconductor material, silicon carbide (SiC) has excellent physical and chemical properties such as a large band-gap width, a high critical breakdown electric field, a high thermal conductivity, and a high electron saturation drift speed. It is widely used in high temperature, high pressure, high power, and radiation resistant semiconductor devices.

With the maturity of the silicon carbide technology, a silicon carbide schottky diode has gradually realized industrialization, but the excessive reverse leakage current of the schottky diode is still the main factor restricting its application in the high voltage field. In order to reduce the shortcoming of excessive reverse leakage current of the schottky diode, a junction barrier schottky diode has been widely studied. The junction barrier schottky diode has a good forward conduction characteristic and a low reverse leakage current characteristic, making it widely used in the field of power electronics.

In the current production process, due to different packaging areas contacted by different positions of the junction barrier schottky device, heat dissipation conditions at different positions of the junction barrier schottky device are different, and finally a center temperature of the junction barrier schottky device is greater than an edge temperature of the junction barrier schottky device. A temperature difference will lead to different carrier mobility in different positions of the junction barrier schottky device, and the carrier mobility will decrease in the position with the high temperature, resulting in uneven current distribution and local electromigration in the chip, which will affect the reliability of the device.

SUMMARY

Accordingly, in order to solve the above-mentioned problems in the related art, the disclosure provides a junction barrier schottky diode. The technical problem to be solved by the disclosure is realized through the following technical solutions:

An embodiment of the disclosure provides a junction barrier schottky diode including a bottom metal layer, a $N^+$-type substrate layer and a $N^-$-type epitaxial layer sequentially arranged in that order from bottom to top, a plurality of P-type ion injection regions are disposed on an upper surface of the $N^-$-type epitaxial layer, distances of the plurality of P-type ion injection regions are gradually increased along a direction from an edge to a center of the junction barrier schottky diode, and each of the distances is a distance of adjacent two of the plurality of P-type ion injection regions in the direction from the edge to the center;

an isolation dielectric layer and a top metal layer are disposed on the $N^-$-type epitaxial layer, the isolation dielectric layer is arranged on a periphery of the upper surface of the $N^-$-type epitaxial layer, the top metal layer is arranged on the upper surface of the $N^-$-type epitaxial layer and an upper surface of the isolation dielectric layer and further is in contact with the plurality of P-type ion injection regions.

In an embodiment, a contact area between the $N^+$-type substrate layer and the bottom metal layer is an ohmic contact area; a contact area between the $N^-$-type epitaxial layer and the top metal layer is a N-type schottky contact area; and a first contact area between one of the plurality of P-type ion injection regions and the top metal layer is one of a P-type schottky contact and an ohmic contact.

In an embodiment, the distances of the plurality of P-type ion injection regions are continuously increased along the direction from the edge to the center of the junction barrier schottky diode.

In an embodiment, the distances of the plurality of P-type ion injection regions are increased in a stepwise manner along the direction from the edge to the center of the junction barrier schottky diode.

In an embodiment, a shape of each of the plurality of P-type ion injection regions viewed from the top is a ring or a rectangle, each of the plurality of P-type ion injection regions has dimensions equal to that of any one of the others of the plurality of P-type ion injection regions, each of the plurality of P-type ion injection regions has a depth equal to or less than 2 μm (micrometers), and each of the distances of the plurality of P-type ion injection regions is equal to or greater than 2 μm.

In an embodiment, grooves are respectively disposed inside the plurality of P-type ion injection regions, depths of the grooves are gradually increased along the direction from the edge to the center of the junction barrier schottky diode, and the top metal layer is disposed inside the grooves.

In an embodiment, a second contact area between a bottom of one of the grooves and the top metal layer is a P-type schottky contact or an ohmic contact.

In an embodiment, the depths of the grooves are continuously increased along the direction from the edge to the center of the junction barrier schottky diode.

In an embodiment, the depths of the grooves are increased in a stepwise manner along the direction from the edge to the center of the junction barrier schottky diode.

In an embodiment, each of the distances of the plurality of P-type ion injection regions is equal to or greater than 3 μm, a thickness of a sidewall of each of the plurality of P-type ion injection regions is equal to or less than 0.8 μm, widths of the plurality of P-type ion injection regions are equal to each other, and a difference between the depth of each of the plurality of P-type ion injection regions and the depth of the corresponding one of the grooves is same as that between the depth of any one of the others of the plurality of the P-type ion injection regions and the depth of corresponding one of the grooves, a width of each of the grooves is equal to or less than 5 μm, and the depth of each of the grooves is equal to or greater than 1 μm.

Compared with the related art, the above technical solutions may have one or more of the following advantages or benefits:

1. The junction barrier schottky diode of the disclosure, by increasing an area of the N-type schottky contact area at the center of the JBS device and reducing an area of the N-type schottky contact area at the edge of the junction barrier schottky device, under the premise of ensuring that the reverse leakage current and forward conduction resistance are not degraded, reduces a temperature difference of the junction barrier schottky device and inhibits effectively the occurrence of local electromigration, and thereby improving the reliability of the device;

2. The junction barrier schottky diode of the disclosure forms a trench junction barrier schottky diode (TJBS) by disposing the grooves respectively inside the plurality of P-type ion injection regions, compared with the junction barrier schottky diode, due to reduce an electric field of the schottky region, the leakage current of the diode is significantly reduced, and by increasing the area of the N-type schottky contact area at the center of the device and reducing an area of the N-type schottky contact area at the edge of the device, under the premise of ensuring that the reverse leakage current and forward conduction resistance are not degraded, the temperature difference of the TJBS device is reduced and the occurrence of local electromigration is effectively inhibited, and thereby improving the reliability of the device.

3. The junction barrier schottky diode of the disclosure avoids the phenomenon that the leakage current of the device increases due to the area increase of the N-type schottky contact area in the center of the device, by increasing the depth of each of the grooves at the center of the device and reducing the depth of each of the grooves at the edge of the device.

The above description is only an overview of the technical solution of the disclosure. In order to understand the technical means of the disclosure more clearly, it can be implemented in accordance with the content of the specification, and in order to make the above and other objectives, features and advantages of the disclosure more obvious and understandable. In the following, the preferred embodiments are cited in conjunction with the drawings, and the detailed description is as follows.

DESCRIPTION OF SYMBOLS

1: bottom metal layer; 2: $N^+$-type substrate layer; 3: $N^-$-type epitaxial layer; 4: P-type ion injection region; 5: groove; 6: isolation dielectric layer; 7: top metal layer; 8: ohmic contact area; 9: N-type schottky contact area; 10: first contact area; 11: second contact area.

DETAILED DESCRIPTION OF EMBODIMENTS

In order to further elaborate the technical means and efficacy adopted by the disclosure to achieve the purpose of the disclosure, a junction barrier schottky diode proposed according to the disclosure is described in detail in combination with the drawings and the specific implementation mode.

The above and other technical contents, features and functions of the disclosure can be clearly shown in the following detailed description of the specific implementation mode with the accompanying drawings. Through the description of the specific implementation mode, we can have a more in-depth and specific understanding of the technical means and efficacy of the disclosure to achieve the purpose. However, the attached drawings are only for reference and illustration, not for limiting the technical solution of the disclosure.

First Embodiment

Figure 1:
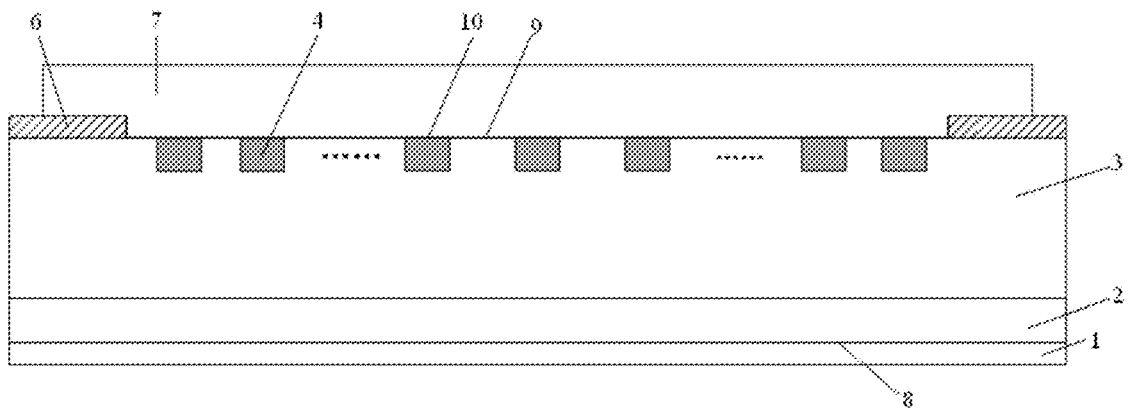
FIG. 1 is a schematic structural view of a junction barrier schottky diode according to an embodiment of the disclosure.

As shown in FIG. 1, FIG. 1 is a schematic structural view of a junction barrier schottky diode according to an embodiment of the disclosure, the embodiment of the disclosure provides the junction barrier schottky (JBS) diode includes, for example, a bottom metal layer 1, a $N^+$-type substrate layer 2 and a $N^-$-type epitaxial layer 3 sequentially arranged in that order from bottom to top. A plurality of P-type ion injection regions 4 are disposed on an upper surface of the $N^-$-type epitaxial layer 3, distances of the plurality of P-type ion injection regions 4 are gradually increased along a direction from an edge to a center of the junction barrier schottky diode, and each of the distances is a distance of adjacent two of the plurality of P-type ion injection regions 4 in the direction from the edge to the center. An isolation dielectric layer 6 and a top metal layer 7 are disposed on the $N^-$-type epitaxial layer 3, the isolation dielectric layer 6 is arranged on a periphery of the upper surface of the $N^-$-type epitaxial layer 3, the top metal layer 7 is arranged on the upper surface of the $N^-$-type epitaxial layer 3 and an upper surface of the isolation dielectric layer 6 and further is in contact with the plurality of P-type ion injection regions 4. Further, a contact area between the $N^+$-type substrate layer 2 and the bottom metal layer 1 is an ohmic contact area 8; a contact area between the $N^-$-type epitaxial layer 3 and the top metal layer 7 is a N-type schottky contact area 9; and a first contact area 10 between one of the plurality of P-type ion injection regions 4 and the top metal layer 7 is one of a P-type schottky contact and an ohmic contact.

Specifically, the bottom metal layer 1 includes a Ni metal layer in contact with the $N^+$-type substrate layer 2, and a Ti metal layer, a Ni metal layer and an Ag metal layer sequentially stacked on a bottom surface of the Ni metal layer in that order. A thickness of the Ni metal layer is 50-100 nm, and a total thickness of the Ti metal layer, the Ni metal layer and the Ag metal layer sequentially stacked is 2-5 μm. The $N^+$-type substrate layer 2 is a highly doped N-type silicon carbide substrate, a thickness of the $N^-$-type epitaxial layer 3 is 10-30 μm, and the isolation dielectric layer 6 is a $SiO_2$ isolation dielectric layer, a thickness of the isolation dielectric layer 6 is 200-500 nm. The top metal layer 7 includes a Ti metal layer in contact with the upper surface of the $N^-$-type epitaxial layer 3 and an upper surface of each of the plurality of P-type ion injection regions 4, and an Al metal layer or an Ag metal layer arranged on the Ti metal layer. A thickness of the Ti metal layer is 50-100 nm, and a thickness of the Al metal layer or the Ag metal layer is 2-5 μm. Each of the plurality of P-type ion injection regions 4 has dimensions equal to that of any one of the others of the plurality of P-type ion injection regions 4, each of the plurality of P-type ion injection regions 4 has a depth equal to or less than 2 μm, and each of the distances of the plurality of P-type ion injection regions 4 is equal to or greater than 2 μm.

In a JBS device, heat dissipation conditions of different positions of the JBS device are different due to different package areas contacted by different positions. Because the area of the N-type schottky contact area 9 is larger, and the current density of the JBS device is higher, the power of the JBS device is higher, and the heating of the JBS device is more serious. By reducing the area of the N-type schottky contact area 9 at the edge of the JBS device and taking an advantage of the good heat dissipation characteristic of the edge of the JBS device, the temperature at the edge of the JBS device can be effectively reduced, but only reducing the area of the N-type Schottky contact area 9 at the edge will weaken the positive characteristics of the JBS device. For the junction barrier schottky diode in this embodiment, due to the distances of the plurality of P-type ion injection regions 4 are gradually increased along the direction from the edge to the center of the junction barrier schottky diode, that is, contact areas of the N-type schottky contact areas 9 are gradually increased along the direction from the edge to the center, that is, by increasing the area of the N-type schottky contact area 9 at the center and reducing the area of the N-type schottky contact area 9 at the edge, under the premise of ensuring that the reverse leakage current and forward on resistance are not degraded, the temperature difference of the JBS device is reduced, and the occurrence of local electromigration is effectively inhibited, and thereby improving the reliability of the device.

Figure 2:
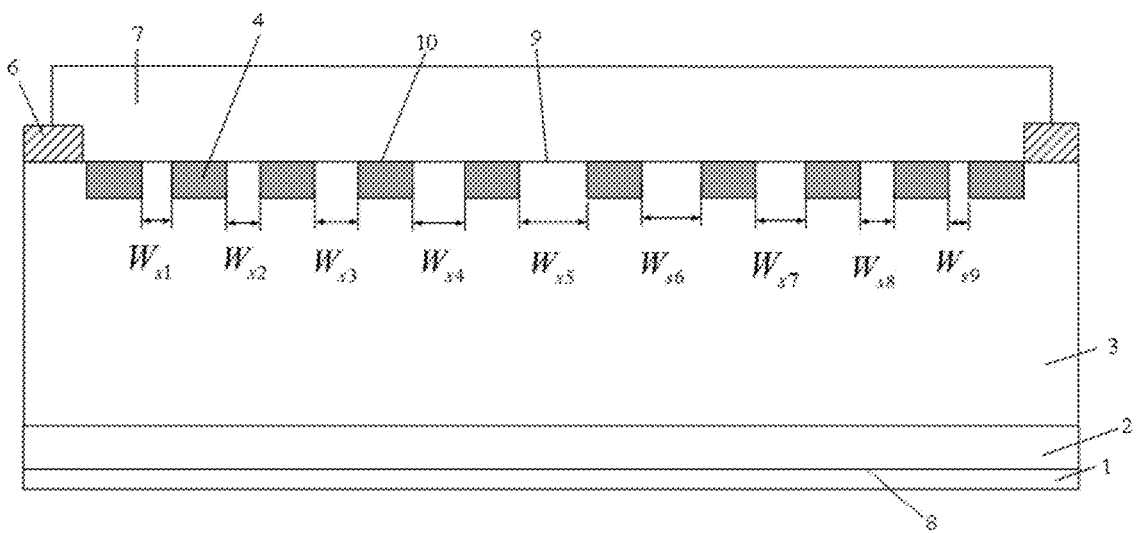
FIG. 2 is a schematic structural view of a junction barrier schottky diode with marked dimensions according to an embodiment of the disclosure.

Further, the distances of the plurality of P-type ion injection regions are continuously increased along the direction from the edge to the center of the junction barrier schottky diode. Specifically, the $N^-$-type epitaxial layer 3 is located between two of the plurality of P-type ion injection regions 4, and the contact area between the $N^-$-type epitaxial layer 3 and the top metal layer 7 is the N-type schottky contact area 9, that is, widths of the N-type schottky contact areas 9 are continuously increased along the direction from the edge to the center of the junction barrier schottky diode. Please refer to FIG. 2, FIG. 2 is a schematic structural view of a junction barrier schottky diode with marked dimensions according to an embodiment of the disclosure. As shown in the FIG. 2, the widths of the N-type schottky contact areas 9 are represented by $W_{S1}$, $W_{S2}$, $W_{S3}$, $W_{S4}$, $W_{S5}$, $W_{S6}$, $W_{S7}$, $W_{S8}$ and $W_{S9}$ from left to right, in this embodiment, a relationship of width dimensions of the N-type schottky contact areas 9 is $W_{S1}<W_{S2}<W_{S3}<W_{S4}<W_{S5}>W_{S6}>W_{S7}>W_{S8}>W_{S9}$, and the difference of the width dimensions of the adjacent two of the N-type schottky contact areas 9 is equal to or less than 10 μm.

In the junction barrier schottky diode of this embodiment, widths of the N-type schottky contact areas 9 are continuously increased along the direction from the edge to the center, that is, the contact areas of the N-type schottky contact areas 9 are continuously increased along the direction from the edge to the center. By increasing the area of the N-type schottky contact area 9 at the center and reducing the area of the N-type schottky contact area 9 at the edge, under the premise of ensuring that the reverse leakage current and forward conduction resistance are not degraded, the temperature difference of the JBS device is reduced and the occurrence of local electromigration is effectively inhibited, and thereby improving the reliability of the device.

Figure 3:
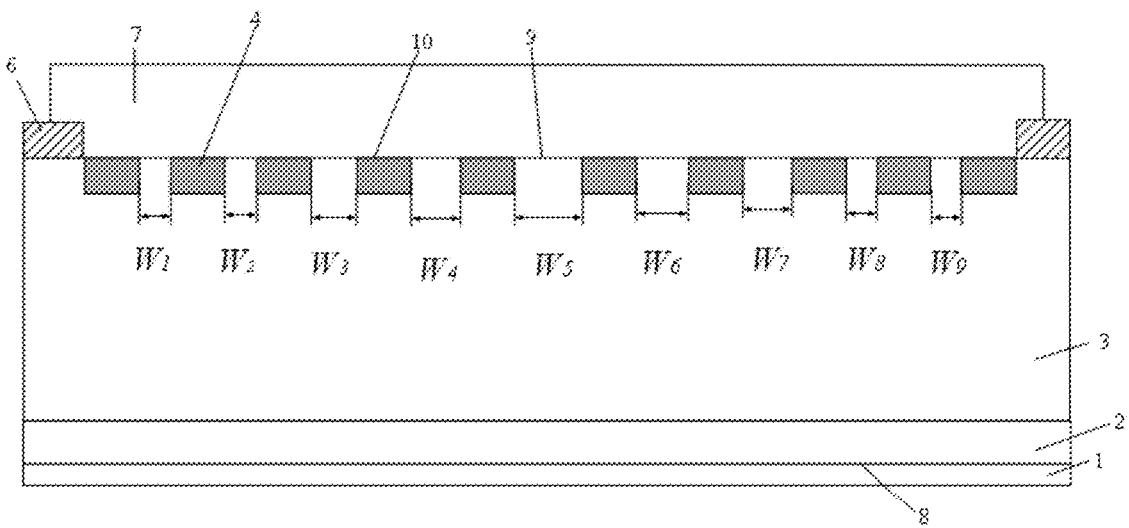
FIG. 3 is a schematic structural view of another junction barrier schottky diode with marked dimensions according to another embodiment of the disclosure.

Further, in other embodiment, the distances of the plurality of P-type ion injection regions are increased in a stepwise manner along the direction from the edge to the center of the junction barrier schottky diode, that is, widths of the N-type schottky contact areas are increased in the stepwise manner along the direction from the edge to the center of the junction barrier schottky diode, as shown in FIG. 3, FIG. 3 is a schematic structural view of another JBS diode with marked dimensions according to another embodiment of the disclosure, as shown in FIG. 3, the widths of the N-type schottky contact areas 9 are represented from left to right by $W_1$, $W_2$, $W_3$, $W_4$, $W_5$, $W_6$, $W_7$, $W_8$, and $W_9$, in this embodiment, a relationship of width dimensions of the N-type schottky contact areas 9 is $W_1=W_2<W_3=W_4<W_5>W_6=W_7>W_8=W_9$. It needs to be understood that in this embodiment, it is not limit to the widths equal of the adjacent two of the N-type schottky contact areas.

In the junction barrier schottky diode in the embodiment, the widths of the N-type schottky contact areas 9 are increased in the stepwise manner along the direction from the edge to the center, that is, contact areas of the N-type schottky contact areas 9 are increased over a distance along the direction from the edge to the center. By increasing the area of the N-type schottky contact area 9 at the center and reducing the area of the schottky contact area 9 at the edge, under the premise of ensuring that the reverse leakage current and forward conduction resistance are not degraded, the temperature difference of the JBS device is reduced and the occurrence of local electromigration is effectively inhibited, and thereby improving the reliability of the JBS device.

Figure 4:
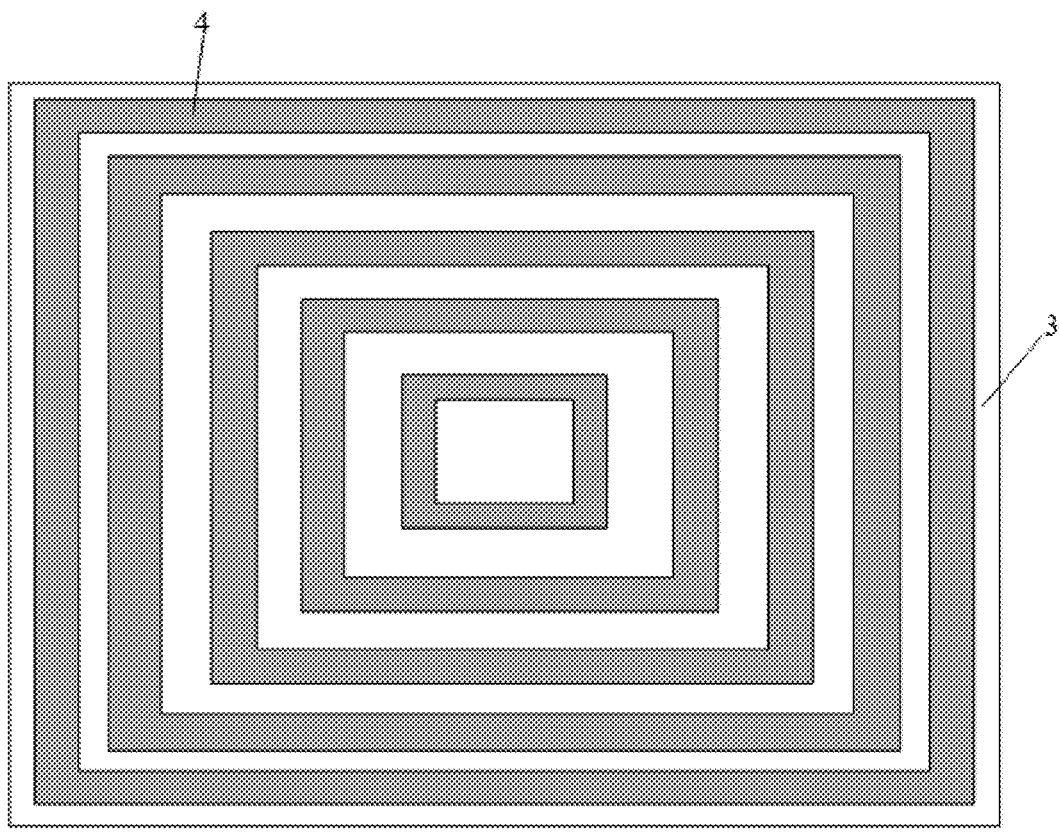
FIG. 4 is a schematic top view of a P-type iron injection region according to an embodiment of the disclosure.
Figure 5:
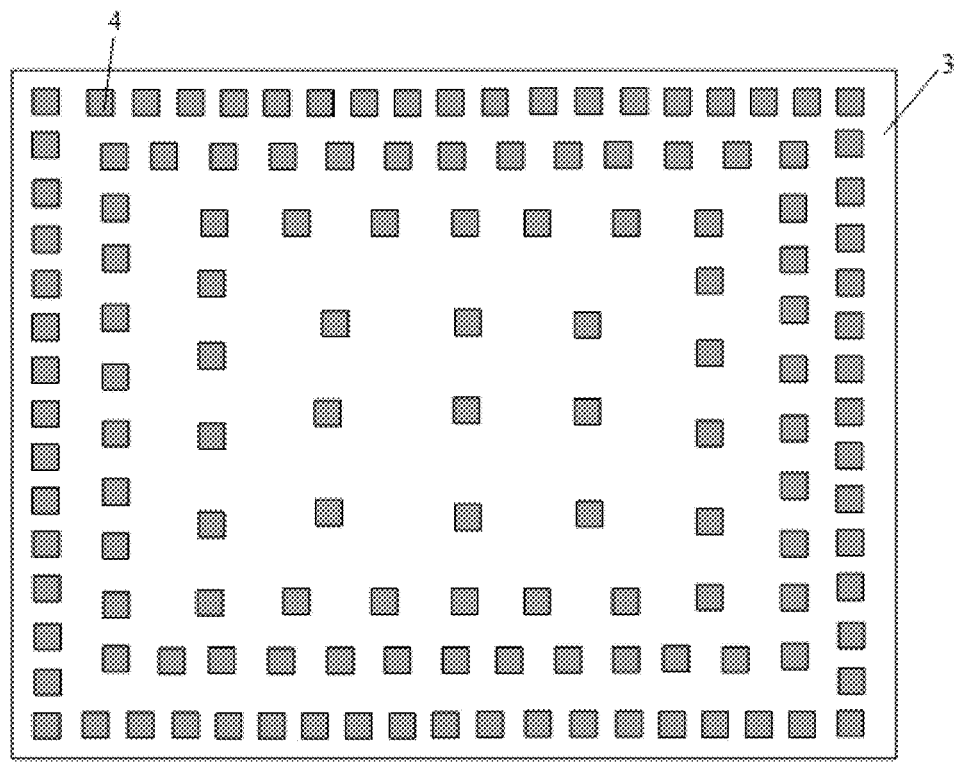
FIG. 5 is a schematic top view of a P-type iron injection region according to another embodiment of the disclosure.

Further, a shape of each of the plurality of P-type ion injection regions 4 viewed from the top is a ring or a rectangle. As shown in FIG. 4, FIG. 4 is a schematic top view of a P-type iron injection region according to an embodiment of the disclosure, as shown in FIG. 4, in the embodiment, the shape of each of the plurality of P-type ion injection regions 4 viewed from the top is the ring, and the ring can be a round or a square. The plurality of P-type ion injection regions 4 are arranged in the periphery of the upper surface of the $N^-$-type epitaxial layer 3 in parallel. Each of the plurality of P-type ion injection regions 4 has a depth equal to or less than 2 μm, and each of the distances of the plurality of P-type ion injection regions 4 is equal to or greater than 2 μm, the distances of the plurality of P-type ion injection regions 4 are gradually increased along the direction from the edge to the center. As shown in FIG. 5, FIG. 5 is a schematic top view of a P-type iron injection region according to another embodiment of the disclosure, in other embodiment, the shape of each of the plurality of P-type ion injection regions 4 viewed from the top is the rectangle, and a rectangular array is distributed in the upper surface of N⁻-type epitaxial layer 3. Each of the plurality of P-type ion injection regions 4 has dimensions equal to that of any one of the others of the plurality of P-type ion injection regions 4, each of the plurality of P-type ion injection regions 4 has a depth equal to or less than 2 μm, and each of the distances of the plurality of P-type ion injection regions 4 is equal to or greater than 2 μm, the distances of the plurality of P-type ion injection regions 4 are gradually increased along the direction from the edge to the center.

Figure 6A:
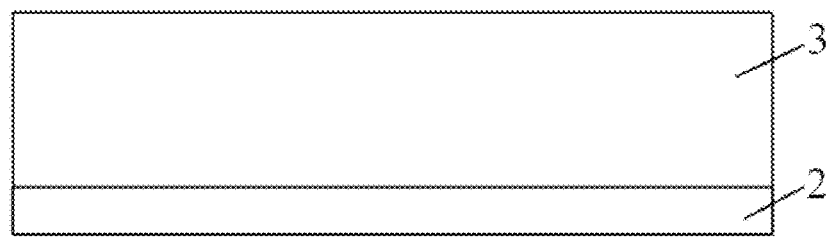
FIGS. 6a-6e are schematic views of a manufacturing process of a junction barrier schottky diode according to an embodiment of the disclosure.
Figure 6B:
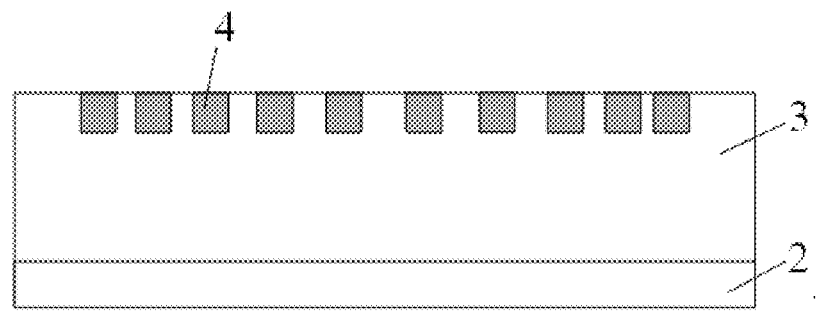
Figure 6C:
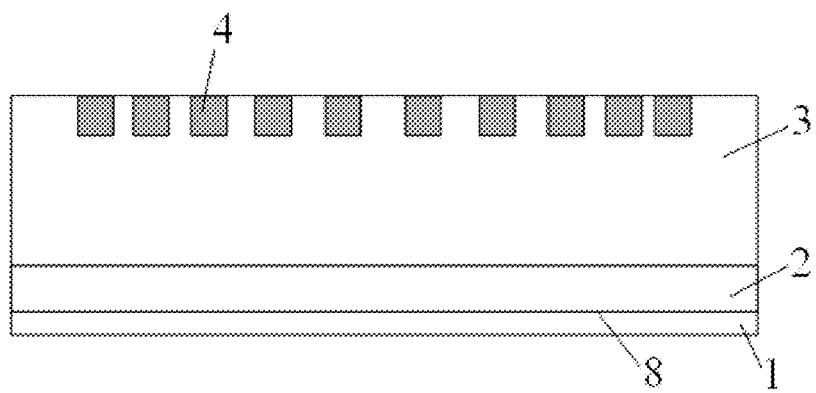
Figure 6D:
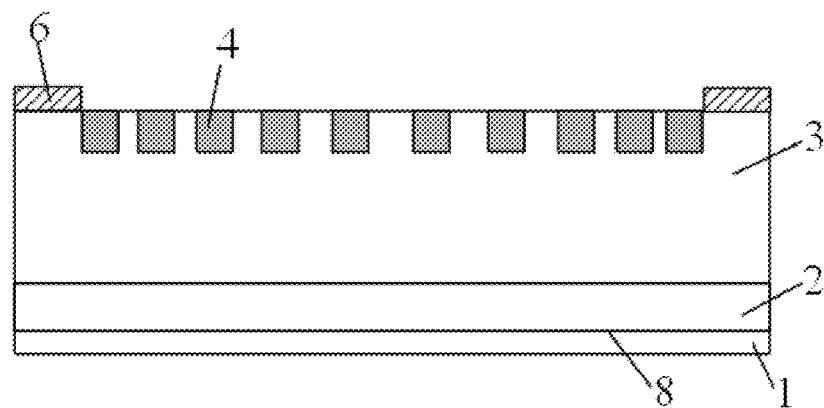
Figure 6E:
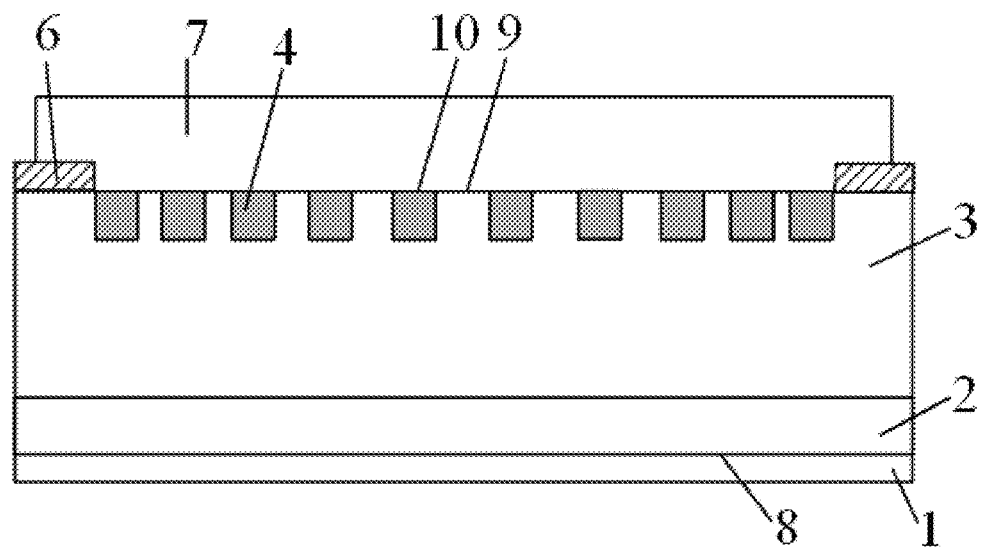

Please see FIGS. 6a-6e, FIGS. 6a-6e are schematic views of a manufacturing process of a junction barrier schottky diode according to an embodiment of the disclosure. A manufacturing method of the junction barrier schottky diode of the embodiment includes the following steps:

step 1: forming a N⁻-type epitaxial layer on a N⁺-type substrate layer by the epitaxial growth. Specifically, as shown in FIG. 6a, selecting a highly doped N-type silicon carbide substrate as the N⁺-type substrate layer 2, firstly, cleaning the N⁺-type substrate layer 2 with the RCA standard, and then forming the N⁻-type epitaxial layer 3 with a thickness of 10-30 μm on a front of the N⁺-type substrate layer 2 by the epitaxial growth.

step 2: forming a plurality of P-type ion injection regions. Specifically, as shown in FIG. 6b, firstly, a SiO₂ with a thickness of 2 μm is deposited as a barrier layer for ion injection in the plurality of P-type ion injection regions; secondly, forming a plurality of injection windows of the plurality of P-type ion injection regions 4 by photolithography and etching, and distances of the plurality of injection windows are gradually increased along the direction from the edge to the center of the JBS diode; finally, forming the plurality of P-type ion injection regions 4 by the ion injection process.

step 3: forming a bottom metal layer. Specifically, as shown in FIG. 6c, forming a Ni metal layer on the lower surface of the N⁺-type substrate layer 2 by the magnetron sputtering, and stacking a Ti metal layer, a Ni metal layer, and a Ag metal layer on the lower surface of the Ni metal layer sequentially in that order to thereby forming the bottom metal layer 1, a thickness of the Ni metal layer is 50-100 nm, and a total thickness of the Ti metal layer, the Ni metal layer and the Ag metal layer sequentially stacked is 2-5 μm. A contact area between the N⁺-type substrate layer 2 and the bottom metal layer 1 is the ohmic contact area 8.

step 4: forming an isolation dielectric layer. Specifically, as shown in FIG. 6d, depositing a SiO₂ isolation dielectric layer with a thickness of 200-500 nm on the N⁻-type epitaxial layer 3, etching the SiO₂ isolation dielectric layer by a lithographic mask to form the isolation dielectric layer 6, and the isolation dielectric layer 6 is arranged on the periphery of the upper surface of the N⁻-type epitaxial layer 3.

step 5: forming a top metal layer. Specifically, as shown in FIG. 6e, forming a Ti metal layer on the upper surface of the N⁻-type epitaxial layer 3 and the upper surface of each of the plurality of P-type ion injection regions 4 by the magnetron sputtering, and forming the Al metal layer or the Ag metal layer on the upper surface of the Ti metal layer, thereby forming the top metal layer 7. A thickness of the Ti metal layer is 50-100 nm, and a thickness of the Al metal layer or the Ag metal layer is 2-5 μm. A contact area between the N⁻-type epitaxial layer 3 and the top metal layer 7 is the N-type schottky contact area 9, and a first contact area 10 between one of the plurality of P-type ion injection regions 4 and the top metal layer 7 is one of a P-type schottky contact and an ohmic contact.

Second Embodiment

Figure 7:
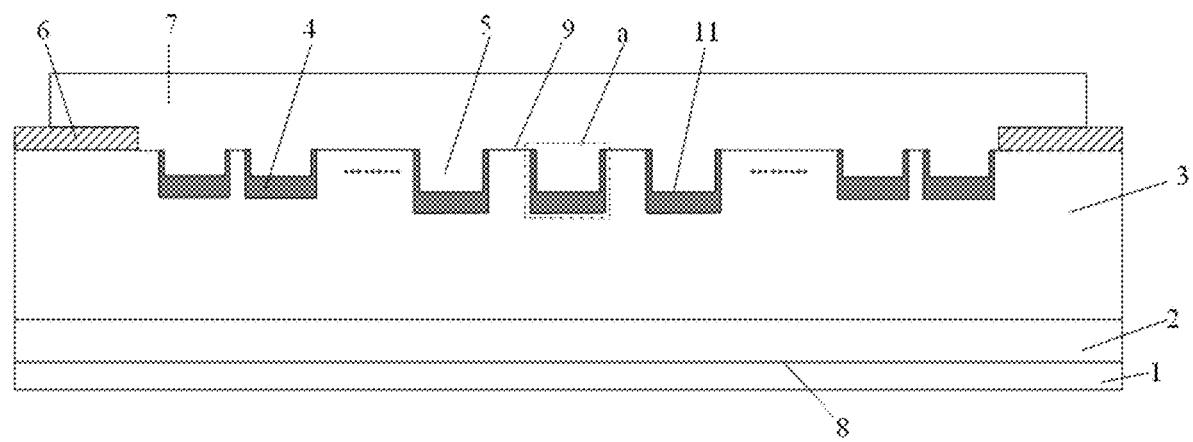
FIG. 7 is a schematic structural view of a junction barrier schottky diode according to another embodiment of the disclosure.

As shown in FIG. 7, FIG. 7 is a schematic structural view of a junction barrier schottky diode according to another embodiment of the disclosure, the embodiment of the disclosure provides the junction barrier schottky (JBS) diode includes, for example, a bottom metal layer 1, a N⁺-type substrate layer 2 and a N⁻-type epitaxial layer 3 sequentially arranged in that order from bottom to top in turn. A plurality of P-type ion injection regions 4 are disposed on an upper surface of the N⁻-type epitaxial layer 3, grooves 5 are respectively disposed inside the plurality of P-type ion injection regions 4, distances of the plurality of P-type ion injection regions 4 are gradually increased along a direction from an edge to a center of the junction barrier schottky diode, and each of the distances is a distance of adjacent two of the plurality of P-type ion injection regions 4 in the direction from the edge to the center. depths of the grooves 5 are gradually increased along the direction from the edge to the center of the junction barrier schottky diode. An isolation dielectric layer 6 and a top metal layer 7 are disposed on the N⁻-type epitaxial layer 3, the isolation dielectric layer 6 is arranged on a periphery of the upper surface of the N⁻-type epitaxial layer 3, the top metal layer 7 is arranged on the upper surface of the N⁻-type epitaxial layer 3 and an upper surface of the isolation dielectric layer 6, and the top metal layer 7 is also disposed inside the grooves 5. Further, a contact area between the N⁺-type substrate layer 2 and the bottom metal layer 1 is an ohmic contact area 8; a contact area between the N⁻-type epitaxial layer 3 and the top metal layer 7 is a N-type schottky contact area 9; and a second contact area 11 between a bottom of one of the grooves 5 and the top metal layer 7 is one of a P-type schottky contact and an ohmic contact.

Figure 8:
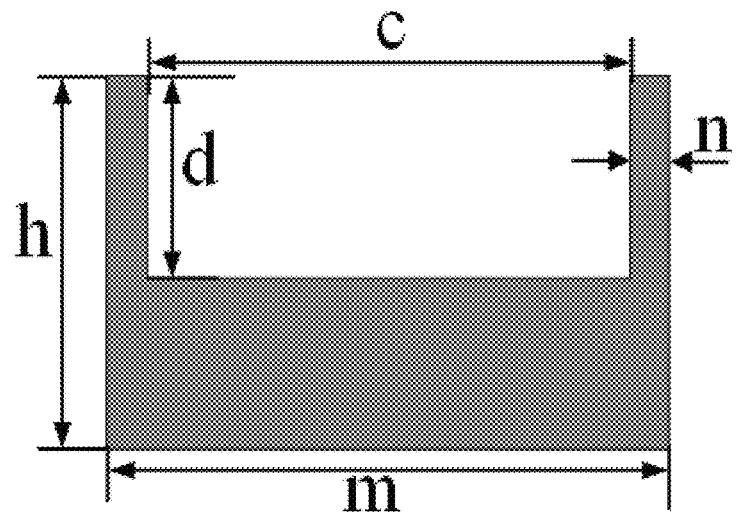
FIG. 8 is a schematic structural view of an area a in FIG. 7 with marked dimensions.

Specifically, the bottom metal layer 1 includes a Ni metal layer in contact with the N⁺-type substrate layer 2, and a Ti metal layer, a Ni metal layer and an Ag metal layer sequentially stacked on a bottom surface of the Ni metal layer in that order. A thickness of the Ni metal layer is 50-100 nm, and a total thickness of the Ti metal layer, the Ni metal layer and the Ag metal layer sequentially stacked is 2-5 μm. The N⁺-type substrate layer 2 is a highly doped N-type silicon carbide substrate, a thickness of the N⁻-type epitaxial layer 3 is equal to or greater than 5 μm. Widths of the plurality of P-type ion injection regions 4 are equal to each other, a difference between the depth of each of the plurality of P-type ion injection regions 4 and the depth of corresponding one of the grooves 5 is the same as that between the depth of any one of the others of the plurality of P-type ion injection regions 4 and the depth of corresponding one of the grooves 5. In this embodiment, as shown in FIG. 8, the depth of each of the plurality of P-type ion injection regions 4 as h≥2.5 μm, a width of each of the plurality of P-type ion injection region 4 as m≤6.2 μm, a thickness of a sidewall of each of the plurality of P-type ion injection regions 4 as m≤0.8 μm, each of the distances of the plurality of P-type ion injection regions 4 is equal to or greater than 3 μm, a width of each of the grooves 5 as c≤5 μm, and the depth of each of the grooves 5 as d≥1 μm. Preferably, the width of each of the grooves 5 as c=3 μm. at this time, the reverse leakage current and the forward conduction resistance of the device are compromised, and the difference h-d between the depth h of each of the plurality of P-type ion injection regions 4 and the depth d of the corresponding one of the grooves 5 remain unchanged. The isolation dielectric layer 6 is a SiO2 isolation dielectric layer, a thickness of the isolation dielectric layer 6 is 200-500 nm. The top metal layer 7 includes a Ti metal layer in contact with the upper surface of the N⁻-type epitaxial layer 3 and an inner surface of each of the grooves 5, and an Al metal layer or an Ag metal layer arranged on the Ti metal layer. A thickness of the Ti metal layer is 50-100 nm, and a thickness of the Al metal layer or the Ag metal layer is 2-5 μm.

The junction barrier schottky diode of the disclosure forms a trench junction barrier schottky (TJBS) diode by disposing the grooves inside respectively the plurality of P-type ion injection regions, compared with the JBS diode, due to reduce an electric field of the schottky region, the leakage current of the diode is significantly reduced, but heat dissipation conditions of different positions of the JBS device are different due to different package areas contacted by different positions. because the area of the N-type schottky contact area 9 is larger, and the current density of the JBS device is higher, the power of the JBS device is higher, and the heating of the JBS device is more serious, and by reducing an area of the N-type schottky contact area 9 at the edge of the TJBS device and taking an advantage of the good heat dissipation characteristic of the edge of the TJBS device, the temperature at the edge of the TJBS device can be effectively reduced, but only reducing the area of the N-type Schottky contact area 9 at the edge will weaken the positive characteristics of the TJBS device.

The junction barrier schottky diode in the embodiment, due to the distances of the plurality of P-type ion injection regions 4 are gradually increased along the direction from the edge to the center of the junction barrier schottky diode, that is, contact areas of the N-type schottky contact areas 9 are gradually increased along the direction from the edge to the center, that is, by increasing the area of the N-type schottky contact area 9 at the center and reducing the area of the N-type schottky contact area at the edge, under the premise of ensuring that the reverse leakage current and forward on resistance are not degraded, the temperature difference of the TJBS device is reduced, and the occurrence of local electromigration is effectively inhibited, and thereby improving the reliability of the device. The area of the N-type schottky contact area 9 increases, and the leakage current of the TJBS device also increase, it can reduce the leakage current of the device by increase the depth of each of the grooves 5, so the junction barrier schottky diode of the disclosure avoids the phenomenon that the leakage current of the device increases due to the area increase of the N-type schottky contact area 9 in the center of the device, by increasing the depth of each of the grooves at the center of the device and reducing the depth of each of the grooves at the edge of the device.

Figure 9:
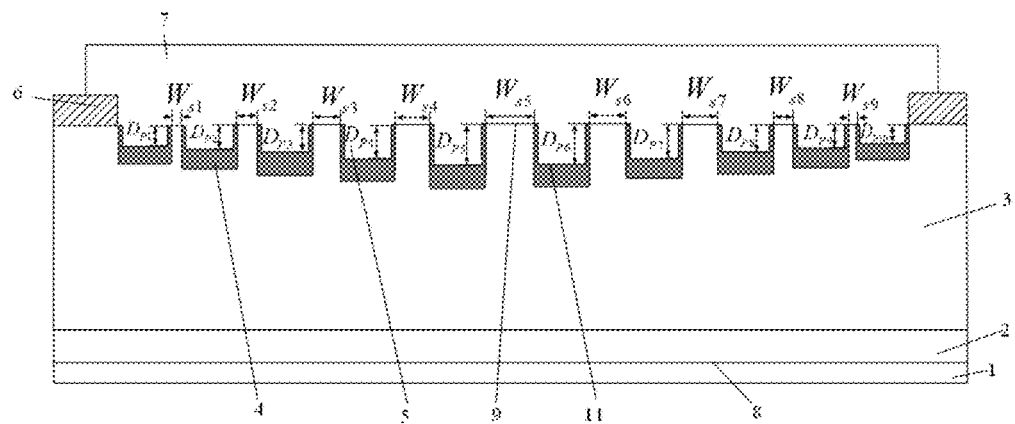
FIG. 9 is a schematic structural view of a junction barrier schottky diode with marked dimensions according to still another embodiment of the disclosure.

Further, the distances of the plurality of P-type ion injection regions 4 are continuously increased along the direction from the edge to the center of the junction barrier schottky diode. Specifically, the N⁻-type epitaxial layer 3 is located between adjacent two of the plurality of P-type ion injection regions 4, and the contact area between the N⁻-type epitaxial layer 3 and the top metal layer 7 is the N-type schottky contact area 9, that is, widths of the N-type schottky contact areas 9 are continuously increased along the direction from the edge to the center of the JBS diode. The depths of the grooves 5 are continuously increased along the direction from the edge to the center of the JBS diode. Please refer to FIG. 9, FIG. 9 is a schematic structural view of a junction barrier schottky diode with marked dimensions according to still another embodiment of the disclosure. As shown in the FIG. 9, the widths of the N-type schottky contact areas 9 are represented by $W_{S1}$, $W_{S2}$, $W_{S3}$, $W_{S4}$, $W_{S5}$, $W_{S6}$, $W_{S7}$, $W_{S8}$ and $W_{S9}$ from left to right, the depths of the grooves 5 are represented by $D_{p1}$, $D_{p2}$, $D_{p3}$, $D_{p4}$, $D_{p5}$, $D_{p6}$, $D_{p7}$, $D_{p8}$ and $D_{p9}$ from left to right, in this embodiment, a relationship of width dimensions of the N-type schottky contact areas 9 is $W_{S1}<W_{S2}<W_{S3}<W_{S4}<W_{S5}>W_{S6}>W_{S7}>W_{S8}>W_{S9}$, a relationship of depth dimensions of the grooves 5 is $D_{p1}<D_{p2}<D_{p3}<D_{p4}<D_{p5}=D_{p6}<D_{p7}<D_{p8}<D_{p9}<D_{p10}$. The difference of width dimensions of adjacent two of the N-type schottky contact areas 9 is equal to er less than 10 μm, the difference of depth dimensions of adjacent two of the grooves 5 is equal to or less than 10 μm.

In the junction barrier schottky diode of this embodiment, the widths of the N-type schottky contact areas 9 are continuously increased along the direction from the edge to the center, that is, contact areas of the N-type schottky contact area 9 are continuously increased along the direction from the edge to the center, and the depths of the grooves 5 are continuously increased along the direction from the edge to the center. By increasing the area of the N-type schottky contact area 9 at the center and reducing the area of the N-type schottky contact area 9 at the edge, under the premise of ensuring that the reverse leakage current and forward conduction resistance are not degraded, the temperature difference of the device is reduced and the occurrence of local electromigration is effectively inhibited, and thereby improving the reliability of the device. At the same time, the junction barrier schottky diode of the disclosure avoids the phenomenon that the leakage current of the device increases due to the area increase of the N-type schottky contact area 9 in the center of the device, by increasing the depth of one of the grooves 5 at the center and reducing the depth of the one of the grooves 5 at the edge.

Figure 10:
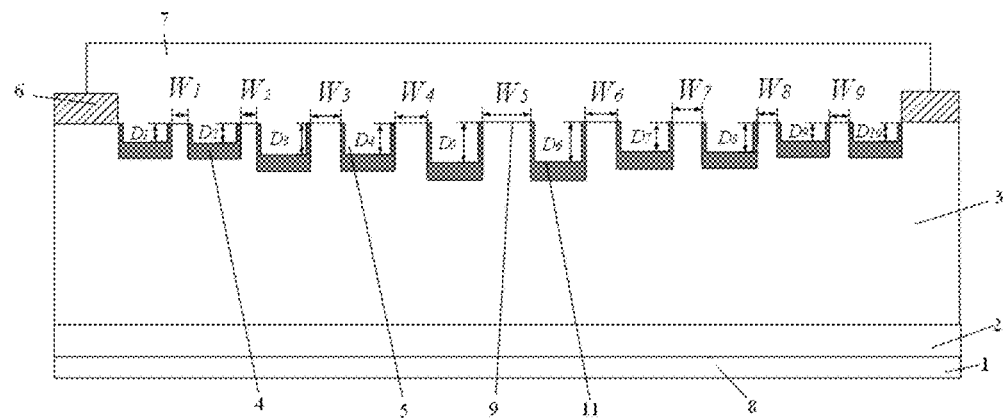
FIG. 10 is a schematic structural view of a junction barrier schottky diode with marked dimensions according to even still another embodiment of the disclosure.

Further, in other embodiment, the distances of plurality of P-type icon injection regions are increased in a stepwise manner along the direction from the edge to the center of the junction barrier schottky diode, that is, the widths of the N-type schottky contact areas 9 are increased in the stepwise manner along the direction from the edge to the center of the junction barrier schottky diode, the depths of the grooves 5 are increased in the stepwise manner along the direction from the edge to the center of the junction barrier schottky diode. As shown in FIG. 10, FIG. 10 is a schematic structural view of a junction barrier schottky diode with marked dimensions according to even still another embodiment of the disclosure, as shown in FIG. 10, the widths of the N-type schottky contact areas 9 are represented from left to right by $W_1$, $W_2$, $W_3$, $W_4$, $W_5$, $W_6$, $W_7$, $W_8$, and $W_9$, the depths of the grooves 5 are represented by $D_{p1}$, $D_{p2}$, $D_{p3}$, $D_{p4}$, $D_{p5}$, $D_{p6}$, $D_{p7}$, $D_{p8}$ and $D_{p9}$ from left to right, in this embodiment, a relationship of width dimensions of the N-type schottky contact areas 9 is $W_1=W_2<W_3=W_4<W_5>W_6=W_7>W_8=W_9$, a relationship of depth dimensions of the grooves 5 is $D_1=D_2<D_3=D_4<D_5=D_6<D_7=D_8<D_9=D_{10}$. It needs to be understood that in this embodiment, it is not limit to the widths equal of the adjacent two of the N-type schottky contact areas 9 and the depths equal of the adjacent two of the grooves 5.

In the junction barrier schottky diode in the embodiment, the widths of the N-type schottky contact areas 9 are increased in the stepwise manner along the direction from the edge to the center, that is, contact areas of the N-type schottky contact areas 9 are increased over a distance along the direction from the edge to the center, the depths of the grooves 5 are increased in the stepwise manner along the direction from the edge to the center of the junction barrier schottky diode, that is, the depths of the grooves 5 are increased over a distance along the direction from the edge to the center. By increasing the area of the N-type schottky contact area 9 at the center and reducing the area of the schottky contact area 9 at the edge, under the premise of ensuring that the reverse leakage current and forward conduction resistance are not degraded, the temperature difference of the JBS device is reduced and the occurrence of local electromigration is effectively inhibited, and thereby improving the reliability of the JBS device. At the same time, the junction barrier schottky diode of the disclosure avoids the phenomenon that the leakage current of the device increases due to the area increase of the N-type schottky contact area 9 at the center of the device, by increasing the depth of one of the grooves 5 at the center and reducing the depth of one of the grooves 5 at the edge.

Further, the shape of one of the plurality of P-type ion injection regions 4 viewed from the top excluding the grooves 5 is a ring or a rectangle, and it is arranged in the periphery of the upper surface of the $N^-$-type epitaxial layer 3 in parallel, and the ring can be a round or a square. The structure is the same with each of the plurality of P-type ion injection regions 4 in the first embodiment, in this embodiment, each of the plurality of P-type ion injection regions 4 has a depth equal to or greater than 2.5 μm, each of the plurality of P-type ion injection regions 4 has a width equal to or less than 6.2 μm. Each of the distances of the plurality of P-type ion injection regions 4 is equal to or greater than 3 μm, and the distances of the plurality of P-type ion injection regions 4 are gradually increased along the direction from the edge to the center.

Figure 11A:
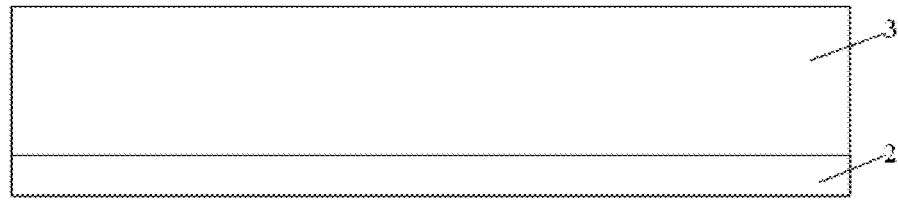
FIGS. 11a-11e are schematic views of a manufacturing process of a junction barrier schottky diode according to another embodiment of the disclosure.

Please see FIGS. 11a-11e, FIGS. 11a-11e are schematic views of a manufacturing process of a JBS diode according to another embodiment of the disclosure. A manufacturing method of the JBS diode of the embodiment includes the following steps:

Step 1: forming a $N^-$-type epitaxial layer on a $N^+$-type substrate layer by the epitaxial growth. Specifically, as shown in FIG. 11a, selecting a highly doped N-type silicon carbide substrate as the $N^+$-type substrate layer 2, firstly, cleaning the $N^+$-type substrate layer 2 with the RCA standard, and then forming the $N^-$-type epitaxial layer 3 with a thickness equal to or greater than 5 μm on a front of the $N^+$-type substrate layer 2 by the epitaxial growth.

Figure 11B:
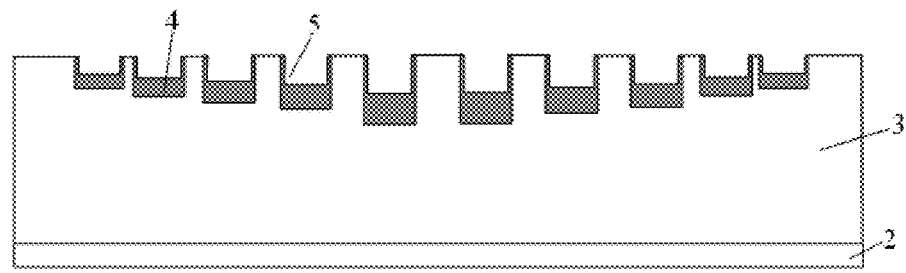

Step 2: forming a plurality of P-type ion injection regions. Specifically, as shown in FIG. 11b, firstly, a $SiO_2$ with a thickness of 2 μm is deposited as a barrier layer for ion injection in the plurality of P-type ion injection regions; secondly, forming a plurality of injection windows of the plurality of P-type ion injection regions 4 by photolithography and etching, and distances of the plurality of the injection windows are gradually increased along the direction from the edge to the center of the JBS diode; finally, forming the plurality of P-type ion injection regions 4 by the ion injection process, grooves 5 are respectively disposed inside the plurality of P-type ion injection regions 4, and the depths of the grooves 5 are gradually increased along the direction from the edge to the center of the junction barrier schottky diode.

Figure 11C:
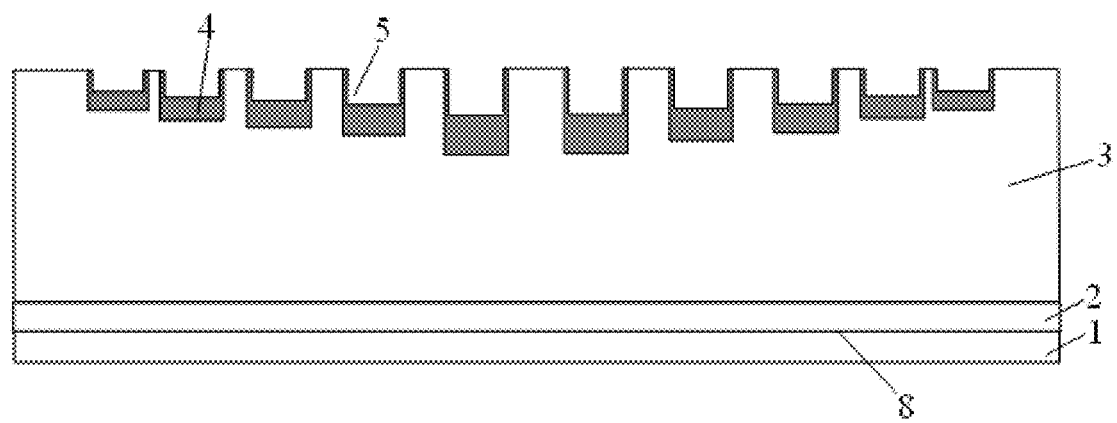

Step 3: forming a bottom metal layer. Specifically, as shown in FIG. 11c, forming a Ni metal layer on the lower surface of the $N^+$-type substrate layer 2 by the magnetron sputtering, and stacking a Ti metal layer, a Ni metal layer, and an Ag metal layer on the lower surface of the Ni metal layer sequentially in that order to thereby forming the bottom metal layer 1, a thickness of the Ni metal layer is 50-100 nm, and a total thickness of the Ti metal layer, the Ni metal layer and the Ag metal layer sequentially stacked is 2-5 μm. The contact area between the $N^+$-type substrate layer 2 and the bottom metal layer 1 is an ohmic contact area 8.

Figure 11D:
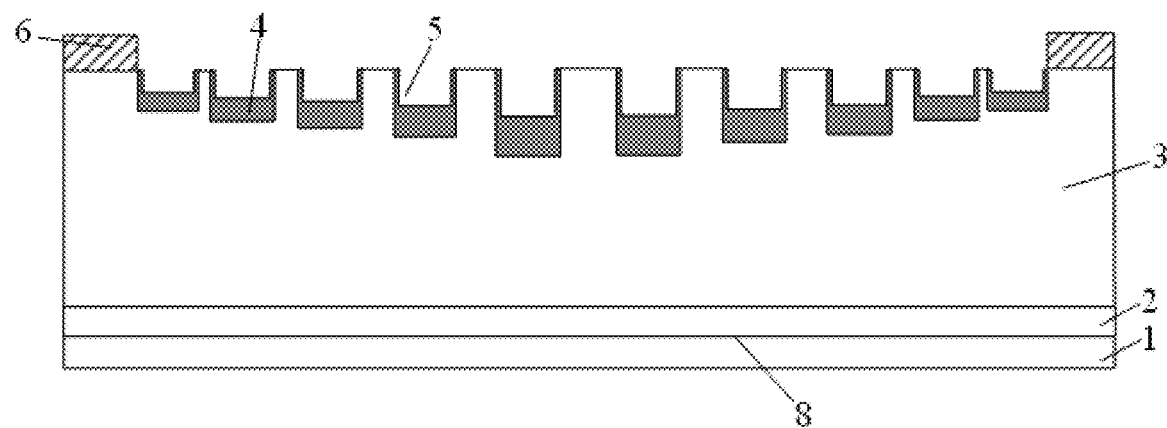

Step 4: forming an isolation dielectric layer. Specifically, as shown in FIG. 11d, depositing a $SiO_2$ isolation dielectric layer with a thickness of 200-500 nm on the $N^-$-type epitaxial layer 3, etching the $SiO_2$ isolation dielectric layer by a lithographic mask to form the isolation dielectric layer 6, and the isolation dielectric layer 6 is arranged on the periphery of the upper surface of the $N^-$-type epitaxial layer 3.

Figure 11E:
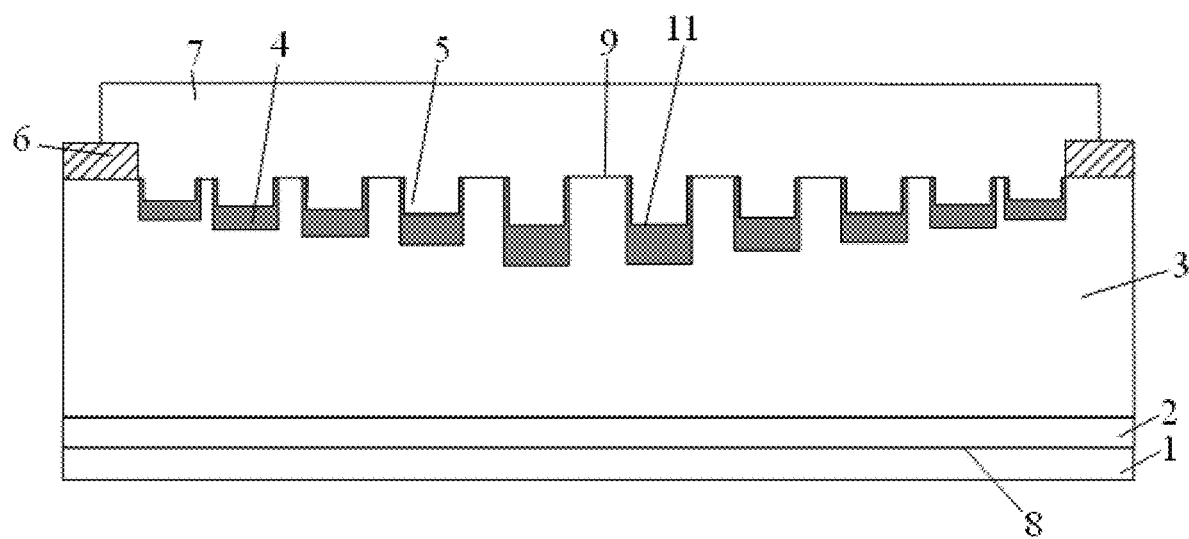

Step 5: forming a top metal layer. Specifically, as shown in FIG. 11e, forming the Ti metal layer on the upper surface of the $N^-$-type epitaxial layer 3 and an inner surface of each of the grooves 5 by the magnetron sputtering, and forming the Al metal layer or the Ag metal layer on an upper surface of the Ti metal layer, thereby forming the top metal layer 7. The thickness of the Ti metal layer is 50-100 nm, and the thickness of the Al metal layer or the Ag metal layer is 2-5 μm. The contact area between $N^-$-type epitaxial layer 3 and the top metal layer 7 is a N-type schottky contact area 9, and the second contact area 11 between the bottom of one of the grooves 5 and the top metal layer 7 is one of a P-type schottky contact and an ohmic contact.

Finally, it should be noted that the foregoing description merely illustrates some embodiments of the disclosure, and is not intended to limit the scope of the disclosure. Although the disclosure has been disclosed in the above embodiments, it is not intended to limit the disclosure. Any person skilled in the art can make some amendments or modifications as equivalent embodiments according to the above disclosed technical contents without departing from the technical scope of the disclosure. As long as they are without departing from the technical scope of the disclosure, any simple amendments, equivalent changes and modifications to the above embodiments according to the technical essence of the disclosure are still within the technical scope of the disclosure.

What is claimed is:

1. A junction barrier schottky diode, comprising: a bottom metal layer, a $N^+$-type substrate layer and a $N^-$-type epitaxial layer sequentially arranged in that order from bottom to top;
   wherein a plurality of P-type ion injection regions are disposed on an upper surface of the $N^-$-type epitaxial layer, distances of the plurality of P-type ion injection regions are increased in a stepwise manner along a direction from an edge to a center of the junction barrier schottky diode, and each of the distances is a distance of adjacent two of the plurality of P-type ion injection regions in the direction from the edge to the center;
   wherein an isolation dielectric layer and a top metal layer are disposed on the $N^-$-type epitaxial layer, the isolation dielectric layer is arranged on a periphery of the upper surface of the $N^-$-type epitaxial layer, the top metal layer is arranged on the upper surface of the $N^-$-type epitaxial layer and an upper surface of the isolation dielectric layer and further is in contact with the plurality of P-type ion injection regions.

2. The junction barrier schottky diode as claimed in claim 1, wherein a contact area between the $N^+$-type substrate layer and the bottom metal layer is an ohmic contact area, a contact area between the $N^-$-type epitaxial layer and the top metal layer is a N-type schottky contact area, and a first contact area between one of the plurality of P-type ion injection regions and the top metal layer is one of a P-type schottky contact and an ohmic contact.

3. The junction barrier schottky diode as claimed in claim 1, wherein a shape of each of the plurality of P-type ion injection regions viewed from the top is a ring or a rectangle, each of the plurality of P-type ion injection regions has dimensions equal to that of any one of the others of the plurality of P-type ion injection regions, each of the plurality of P-type ion injection regions has a depth equal to or less than 2 μm, and each of the distances of the plurality of P-type ion injection regions is equal to or greater than 2 μm.

4. The junction barrier schottky diode as claimed in claim 1, wherein grooves are respectively disposed inside the plurality of P-type ion injection regions, depths of the grooves are gradually increased along the direction from the edge to the center of the junction barrier schottky diode, and the top metal layer is disposed inside the grooves.

5. The junction barrier schottky diode as claimed in claim 4, wherein a second contact area between a bottom of one of the grooves and the top metal layer is a P-type schottky contact or an ohmic contact.

6. The junction barrier schottky diode as claimed in claim 4, wherein the depths of the grooves are continuously increased along the direction from the edge to the center of the junction barrier schottky diode.

7. The junction barrier schottky diode as claimed in claim 4, wherein the depths of the grooves are increased in a stepwise manner along the direction from the edge to the center of the junction barrier schottky diode.

8. The junction barrier schottky diode as claimed in claim 4, wherein each of the distances of the plurality of P-type ion injection regions is equal to or greater than 3 μm, a thickness of a sidewall of each of the plurality of P-type ion injection regions is equal to or less than 0.8 μm, widths of the plurality of P-type ion injection regions are equal to each other, and a difference between the depth of each of the plurality of P-type ion injection regions and the depth of corresponding one of the grooves is the same as that between the depth of any one of the others of the plurality of P-type ion injection regions and the depth of corresponding one of the grooves, a width of each of the grooves is equal to or less than 5 μm, and the depth of each of the grooves is equal to or greater than 1 μm.

9. A junction barrier schottky diode, comprising: a bottom metal layer, a N$^+$-type substrate layer and a N$^-$-type epitaxial layer sequentially arranged in that order from bottom to top;
wherein a plurality of P-type ion injection regions are disposed on an upper surface of the N$^-$-type epitaxial layer, distances of the plurality of P-type ion injection regions are gradually increased along a direction from an edge to a center of the junction barrier schottky diode, and each of the distances is a distance of adjacent two of the plurality of P-type ion injection regions in the direction from the edge to the center;
wherein an isolation dielectric layer and a top metal layer are disposed on the N$^-$-type epitaxial layer, the isolation dielectric layer is arranged on a periphery of the upper surface of the N$^-$-type epitaxial layer, the top metal layer is arranged on the upper surface of the N$^-$-type epitaxial layer and an upper surface of the isolation dielectric layer and further is in contact with the plurality of P-type ion injection regions;
wherein grooves are respectively disposed inside the plurality of P-type ion injection regions, depths of the grooves are gradually increased along the direction from the edge to the center of the junction barrier schottky diode, and the top metal layer is disposed inside the grooves.

10. The junction barrier schottky diode as claimed in claim 9, wherein a second contact area between a bottom of one of the grooves and the top metal layer is a P-type schottky contact or an ohmic contact.

11. The junction barrier schottky diode as claimed in claim 9, wherein the depths of the grooves are continuously increased along the direction from the edge to the center of the junction barrier schottky diode.

12. The junction barrier schottky diode as claimed in claim 9, wherein the depths of the grooves are increased in a stepwise manner along the direction from the edge to the center of the junction barrier schottky diode.

13. The junction barrier schottky diode as claimed in claim 9, wherein each of the distances of the plurality of P-type ion injection regions is equal to or greater than 3 μm, a thickness of a sidewall of each of the plurality of P-type ion injection regions is equal to or less than 0.8 μm, widths of the plurality of P-type ion injection regions are equal to each other, and a difference between the depth of each of the plurality of P-type ion injection regions and the depth of corresponding one of the grooves is the same as that between the depth of any one of the others of the plurality of P-type ion injection regions and the depth of corresponding one of the grooves, a width of each of the grooves is equal to or less than 5 μm, and the depth of each of the grooves is equal to or greater than 1 μm.

14. The junction barrier schottky diode as claimed in claim 9, wherein a contact area between the N$^+$-type substrate layer and the bottom metal layer is an ohmic contact area, a contact area between the N$^-$-type epitaxial layer and the top metal layer is a N-type schottky contact area, and a first contact area between one of the plurality of P-type ion injection regions and the top metal layer is one of a P-type schottky contact and an ohmic contact.

15. The junction barrier schottky diode as claimed in claim 9, wherein the distances of the plurality of P-type ion injection regions are continuously increased along the direction from the edge to the center of the junction barrier schottky diode.

16. The junction barrier schottky diode as claimed in claim 9, wherein a shape of each of the plurality of P-type ion injection regions viewed from the top is a ring or a rectangle, each of the plurality of P-type ion injection regions has dimensions equal to that of any one of the others of the plurality of P-type ion injection regions, each of the plurality of P-type ion injection regions has a depth equal to or less than 2 μm, and each of the distances of the plurality of P-type ion injection regions is equal to or greater than 2 μm.

* * * * *